(12) United States Patent
Okamoto

(10) Patent No.: US 8,822,983 B2
(45) Date of Patent: Sep. 2, 2014

(54) ORGANIC ELECTROLUMINESCENT DISPLAY DEVICE AND MANUFACTURING METHOD THEREOF

(75) Inventor: Ken Okamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 396 days.

(21) Appl. No.: 13/148,935

(22) PCT Filed: Feb. 17, 2010

(86) PCT No.: PCT/JP2010/000995
§ 371 (c)(1),
(2), (4) Date: Aug. 10, 2011

(87) PCT Pub. No.: WO2010/134237
PCT Pub. Date: Nov. 25, 2010

(65) Prior Publication Data
US 2011/0315966 A1    Dec. 29, 2011

(30) Foreign Application Priority Data
May 22, 2009    (JP) ................................ 2009-124383

(51) Int. Cl.
| | |
|---|---|
| H01L 29/08 | (2006.01) |
| H01L 35/24 | (2006.01) |
| H01L 51/00 | (2006.01) |
| H05B 33/26 | (2006.01) |
| H01L 51/52 | (2006.01) |
| H05B 33/24 | (2006.01) |

(52) U.S. Cl.
CPC ............ *H05B 33/26* (2013.01); *H01L 51/5206* (2013.01); *H05B 33/24* (2013.01); *H01L 51/0096* (2013.01); *H01L 51/5271* (2013.01); *H01L 51/5218* (2013.01)
USPC .................... 257/40; 257/79; 438/22; 438/99

(58) Field of Classification Search
None
See application file for complete search history.

(56) References Cited

U.S. PATENT DOCUMENTS

| | | | |
|---|---|---|---|
| 2005/0115503 A1* | 6/2005 | Hagiwara et al. .............. | 118/721 |
| 2005/0208330 A1* | 9/2005 | Raychaudhuri et al. ...... | 428/690 |

FOREIGN PATENT DOCUMENTS

| | | |
|---|---|---|
| JP | 5-3080 A | 1/1993 |
| JP | 10-340787 A | 12/1998 |
| JP | 2000-40592 A | 2/2000 |
| JP | 2004-31324 A | 1/2004 |
| JP | 2006-244850 A | 9/2006 |

OTHER PUBLICATIONS

Zhao et al., Dual role of LiF as a hole-injection buffer in organic light-emitting diodes, Applied Physics Letters, vol. 84, No. 15.*
International Search Report received for PCT Patent Application No. PCT/JP2010/000995, mailed on May 11, 2010, 6 pages (3 pages of English Translation and 3 pages of International Search Report).

* cited by examiner

*Primary Examiner* — Andres Munoz
(74) *Attorney, Agent, or Firm* — Morrison & Foerster LLP

(57) ABSTRACT

An organic electroluminescent display device (10) includes: a substrate (11); a first electrode (14) which is provided on the substrate (11), and in which at least a surface portion located on an opposite side from the substrate (11) is made of silver or silver alloy; and an organic electroluminescent layer (15) provided on the first electrode (14).

9 Claims, 4 Drawing Sheets

ORGANIC ELECTROLUMINESCENT DISPLAY DEVICE AND MANUFACTURING METHOD THEREOF

CROSS REFERENCE TO RELATED APPLICATIONS

This is a U.S. National Phase patent application of PCT/JP2010/000995, filed Feb. 17, 2010, which claims priority to Japanese Patent Application No. 2009-124383, filed May 22, 2009, each of which is hereby incorporated by reference in the present disclosure in its entirety.

TECHNICAL FIELD

The present invention relates to organic electroluminescent (EL) display devices and manufacturing methods thereof.

BACKGROUND ART

Organic EL display devices are self light-emitting display devices having wide viewing-angle characteristics, high visibility, and low power consumption. Thus, in recent years, the organic EL display devices have received attention as next-generation flat panel display devices.

An organic EL display device has a thin film transistor (TFT) substrate, and a first electrode, an organic EL layer, and a second electrode, which are sequentially stacked on the TFT substrate. When TFTs of the TFT substrate are turned on, holes are injected from the first electrode to the organic EL layer, and electrons are injected from the second electrode to the organic EL layer. The electrons in the excited state due to recombination with the holes release deactivation energy when returning to the ground state. This deactivation energy is emitted as light from the organic EL display device.

Silver or silver alloy is preferably used as a material of the first electrode as silver and silver alloy have high light-reflecting and light-transmitting properties. However, the surface of silver and silver alloy is oxidized due to a surface treatment such as etching and an ultraviolet (UV)/ozone treatment, and silver oxide thus produced can degrade electrode characteristics. Thus, a transparent electrode such as indium tin oxide (ITO) is stacked on the surface of a conductive film of silver or silver alloy (e.g., Patent Document 1).

CITATION LIST

Patent Document

PATENT DOCUMENT 1: Japanese Patent Publication No. 2004-31324

SUMMARY OF THE INVENTION

Technical Problem

However, if the first electrode is formed by stacking the transparent electrode such as ITO on the surface of the conductive film of silver or silver alloy, the transparent electrode provided at the surface of the first electrode degrades the light-reflecting property, and thus reduces luminance. Moreover, when the first electrode having the upper layer of ITO, etc. stacked on silver or silver alloy is patterned by etching, the lower layer of silver or silver alloy is more susceptible to the etching than the transparent electrode such as ITO. Thus, the lower layer portion of silver or silver alloy in the first electrode is excessively etched, whereby a void may be created. Water, oxygen, etc. may enter the organic EL layer from the void through the first electrode, thereby degrading light emission characteristics.

It is an object of the present invention to provide an organic EL display device having high luminance by implementing preferable light-reflecting and light-transmitting properties in the first electrode.

Solution to the Problem

An organic electroluminescent display device according to the present invention includes: a substrate; a first electrode which is provided on the substrate, and in which at least a surface portion located on an opposite side from the substrate is made of silver or silver alloy; and an organic electroluminescent layer provided on the first electrode.

With the above configuration, since the surface portion of the first electrode located on the opposite side from the substrate is made of silver or silver alloy, the first electrode is allowed to have a preferable light-reflecting property and a preferable light-transmitting property, whereby high-luminance light emission can be obtained.

It is preferable that the first electrode be made of only the silver or the silver alloy.

With the above configuration, since the first electrode is made of only the silver or the silver alloy, the first electrode can be easily formed.

It is preferable that at least the surface portion of the first electrode located on the opposite side from the substrate contain 0.01 to 10.0 mass % of oxygen.

With the above configuration, the surface portion of the first electrode contains 10.0 mass % or less of oxygen. This oxygen content rate is higher than 0.01 mass % that is an oxygen content rate of the surface portion of the first electrode immediately after the silver film or the silver alloy film is formed. However, the first electrode exhibit excellent electrode characteristics in terms of the light-reflecting property and the light-transmitting property, whereby high-luminance organic EL light emission can be obtained.

It is preferable that an angle between the substrate and a wall surface of the first electrode in a cross section of the first electrode be 80 to 95°.

With the above configuration, in the case where the angle between the substrate and the wall surface of the first electrode in the cross section of the first electrode is 90 to 95°, the surface area of the wall surface of the first electrode can be reduced as compared to the case where the angle is more than 95°. Thus, the amount of water entering the first electrode from the wall surface can be reduced, thereby reducing degradation of the organic EL layer by the entrance of the water. In the case where the angle between the substrate and the wall surface of the first electrode in the cross section of the first electrode is 80-90°, the wall surface of the first electrode is tilted in a direction away from the organic EL layer. This makes it difficult for the water that has entered from the wall surface of the first electrode to reach the organic EL layer, thereby reducing degradation of the organic EL layer due to the entrance of the water.

The organic electroluminescent display device may further include an oxygen trap layer provided between the first electrode and the organic electroluminescent layer.

With the above configuration, the oxygen trap layer is capable of trapping active oxygen produced from the silver oxide contained in the surface portion of the first electrode, thereby reducing degradation of organic EL light emission characteristics due to entrance of the active oxygen into the organic EL layer.

The organic electroluminescent display device may further include an oxygen blocking layer provided between the first electrode and the organic electroluminescent layer.

With the above configuration, the oxygen blocking layer is capable of blocking active oxygen or radicals produced from the silver oxide contained in the surface portion of the first electrode so as not to allow the active oxygen or radicals to enter the organic EL layer, thereby reducing degradation of organic EL light emission characteristics by the active oxygen.

In this case, it is preferable that the oxygen blocking layer be made of any of an alkali metal compound, an alkaline earth metal compound, a low conductive metal, and a metal oxide.

It is preferable that the oxygen blocking layer have a thickness of 0.1 to 3 nm

With the above configuration, since the thickness of the oxygen blocking layer is 0.1 nm or more, the oxygen blocking layer sufficiently produces an effect of blocking oxygen, etc. Moreover, since the thickness of the oxygen blocking layer is 3 nm or less, the oxygen blocking layer can maintain its own conductive property. Moreover, providing the oxygen blocking layer can suppress an increase in drive voltage of the organic EL display device.

The organic electroluminescent display device may be of a top emission type that emits light from the opposite side from the substrate.

The organic electroluminescent display device may be of a bottom emission type that emits light from a side of the substrate.

The organic electroluminescent display device may be of an inverted top emission type in which the first electrode is a cathode, and which emits light from the opposite side from the substrate.

A method for manufacturing an organic electroluminescent display device according to the present invention includes: a first electrode formation step including a first electrode patterning step of forming a silver film or a silver alloy film on the substrate and etching the silver film or the silver alloy film, a pretreatment step of performing a UV/ozone treatment and/or an oxygen plasma treatment on the substrate having the silver film or the silver alloy film patterned in the first electrode patterning step, and a silver oxide decomposition step of decomposing silver oxide formed in the pretreatment step.

In the above manufacturing method, even if the silver oxide is produced due to the UV/ozone treatment and/or the oxygen plasma treatment, the silver oxide is decomposed after the pretreatment, whereby degradation of electrode characteristics in the surface portion of the first electrode can be reduced.

According to the manufacturing method of the present invention, in the silver oxide decomposition step, the silver oxide may be decomposed by performing a baking treatment under an atmosphere having a pressure of $10^{-4}$ Pa or less or under a nitrogen atmosphere.

In the above manufacturing method, the baking treatment is performed under the atmosphere having a pressure of $10^{-4}$ Pa or less or under the nitrogen atmosphere at a temperature equal to or higher than the decomposition temperature of the silver oxide, thereby facilitating decomposition of the silver oxide.

In the silver oxide decomposition step, the silver oxide may be decomposed by using a reduction agent under an atmosphere having an oxygen concentration equal to or less than an atmospheric oxygen concentration.

In the above manufacturing method, the silver oxide reacts with the reducing agent under the atmosphere having the oxygen concentration equal to or less than the atmospheric oxygen concentration, thereby facilitating the reduction reaction of the silver oxide.

In this case, it is preferable that the reduction agent that is used in the silver oxide decomposition step be any of hydrogen, carbon, carbon monoxide, and sodium hydrogen carbonate.

Alternatively, in the silver oxide decomposition step, the silver oxide may be decomposed by radiating light under an atmosphere having a pressure of $10^{-4}$ Pa or less or under a nitrogen atmosphere.

In the above manufacturing method, the light radiation under the atmosphere having a pressure of $10^{-4}$ Pa or less or under the nitrogen atmosphere can facilitate decomposition of the silver oxide.

Advantages of the Invention

According to the present embodiment, since the surface portion of the first electrode located on the opposite side from the substrate is made of silver or silver alloy, preferable light-reflecting and light-transmitting properties can be implemented in the first electrode, whereby light emission with high light luminance can be obtained.

DESCRIPTION OF EMBODIMENTS (First Embodiment)
[Organic EL Display Device]

Figure 1:
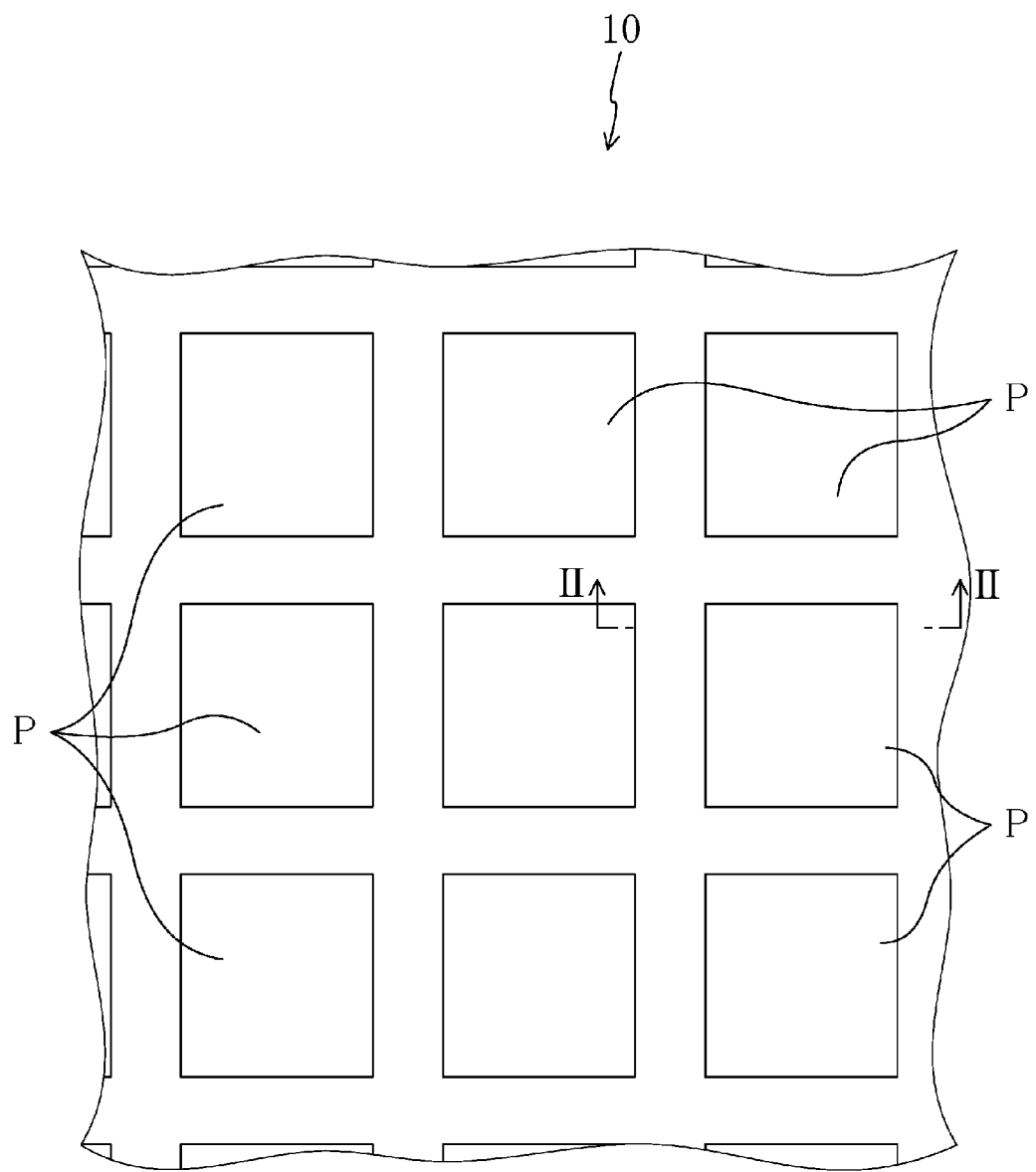
FIG. 1 is a plan view of an organic EL display device according to a first embodiment.
Figure 2:
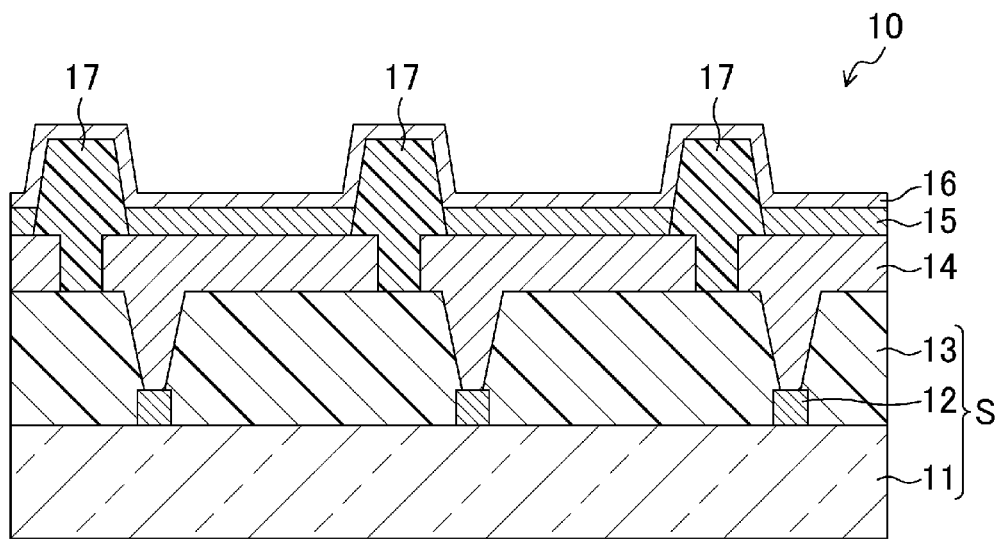
FIG. 2 is a cross-sectional view taken along line II-II in FIG. 1.

FIGS. 1 and 2 show an example of an organic EL display device 10 of a first embodiment. The organic EL display device 10 is used for, e.g., displays of mobile phones, portable media players, etc.

The organic EL display device 10 has a TFT substrate S including TFTs 12 provided on a substrate 11 and an interlayer insulating film 13 covering the surface of the substrate 11. A first electrode 14, an organic EL layer 15, and a second electrode 16 are sequentially stacked on the TFT substrate S, and are sealed by a sealing member under an inert gas atmosphere. A plurality of light-emitting regions P are formed in a matrix pattern by these components. The organic EL display device 10 displays an image by the light-emitting regions P. When the organic EL display device 10 provides an RGB full color display, a plurality of pixels are formed by three types of sub-pixels, namely red sub-pixels, green sub-pixels, and blue sub-pixels.

In the TFT substrate S, e.g., a plurality of gate lines extending parallel to each other in the horizontal direction, and a plurality of signal lines extending in a direction perpendicular to the gate lines are provided on the substrate 11 that is made of an insulating material, such as a glass substrate, a plastic substrate, etc. The TFTs 12 are provided in a matrix pattern in each light-emitting region P of the TFT substrate S at intersections of the gate lines and the signal lines, and the interlayer insulating film 13 is provided over the substrate 11 so as to cover the interconnects and the TFTs 12. The TFT substrate S has, e.g., a thickness of about 0.7 mm, a longitudinal length of about 400 mm, and a lateral length of about 300 mm.

The TFTs 12 have a function as switching elements in each light-emitting region P. A material of the TFTs 12 is, e.g., an inorganic semiconductor material such as amorphous silicon semiconductor or polysilicon semiconductor, etc.

A material of the interlayer insulating film 13 is, e.g., a nitrogen oxide film, an acrylic resin film, a polyimide film, etc. Contact holes are provided in the interlayer insulating film 13 so as to correspond to the TFTs 12, respectively. The interlayer insulating film 13 has a thickness of, e.g., 2-3 µm.

In the case where the interlayer insulating film 13 is formed as, e.g., a stacked body of a nitrogen oxide film and an acrylic resin film, the acrylic resin film functions as a planarizing film. It is preferable that concaves and convexes at the surface of the acrylic resin film of the interlayer insulating film 13 have a height of 100 nm or less. Thus, it is preferable that the acrylic resin film have a thickness of about 8 µm. Note that the height of the concaves and convexes at the surface of the acrylic resin film can be measured by a stylus profilometer.

The first electrode 14 is provided in an island pattern on the interlayer insulating film 13 so as to correspond to each light-emitting region P, and is electrically connected to the TFTs 12 via the contact holes formed in the interlayer insulating film 13. The first electrode 14 has a function to inject holes into the organic EL layer 15. The first electrode 14 is made of silver or silver alloy. The silver alloy is, e.g., palladium-copper alloy, silver-copper alloy, etc. The first electrode 14 may be formed by a single layer made of only a silver film, may be formed by a single layer made of a silver alloy film, or may be formed by stacking a plurality of kinds of silver alloy films or by stacking a silver film and a silver alloy film. In order to facilitate fabrication of the first electrode 14, it is preferable that the first electrode 14 be formed by a single layer of a silver film or a single layer of a silver alloy film. The first electrode 14 has a thickness of, e.g., about 100 nm.

Silver of the silver film or silver contained in the silver alloy film of the first electrode 14 is oxidized due to a UV/ozone treatment, etc. that is performed after the silver film or the silver alloy film is formed on the TFT substrate S. Silver oxide thus produced is thermally decomposed by a baking treatment, so that a surface portion of the first electrode 14 contains, e.g., 10.0 mass % or less of oxygen. This oxygen content rate after the decomposition of silver oxide is 0.01 mass % or more. Although this value is higher than the oxygen content rate immediately after formation of the silver film or the silver alloy film, high light reflectance and low light transmittance, which are about the same as those immediately after formation of the silver film or the silver alloy film, are obtained.

The island pattern of the first electrode 14 has, e.g., a rectangular shape having a longitudinal length of about 90 µm and a lateral length of about 30 µm.

In a cross section of the first electrode 14, the angle between the TFT substrate S and a wall surface of the first electrode 14 is preferably 95° or less in order to reduce degradation of light emission characteristics due to entrance of water, etc. from the wall surface of the first electrode 14 into the organic EL layer 15. In the case where the angle θ between the TFT substrate S and the wall surface of the first electrode 14 in the cross section of the first electrode 14 is 90-95°, the surface area of the wall surface of the first electrode 14 is smaller than that in the case where the angle θ is more than 95°. Thus, the amount of water entering from the wall surface of the first electrode 14 can be reduced. In the case where the angle θ between the TFT substrate S and the wall surface of the first electrode 14 in the cross section of the first electrode 14 is 80-90°, the wall surface of the first electrode 14 is tilted in a direction away from the organic EL layer 15. This makes it difficult for the water that has entered from the wall surface to reach the organic EL layer 15, thereby reducing entrance of the water into the organic EL layer 15. Note that in the case where the angle θ between the TFT substrate S and the wall surface of the first electrode 14 in the cross section of the first electrode 14 is less than 80°, the wall surface of the first electrode 14 is located farther away from the organic EL layer 15, but the increased tilting of the wall surface of the first electrode 14 facilitates entrance of water, etc. Moreover, adjoining islands of the first electrode 14 may be electrically connected together. Accordingly, the angle θ of less than 80° is not preferable. For these reasons, the angle θ between the TFT substrate S and the wall surface of the first electrode 14 in the cross section of the first electrode 14 is preferably 80-95°, and more preferably 85-90°.

An edge cover 17 is provided corresponding to a region where the first electrode 14 is not provided, so as to cover the peripheral edge of the first electrode 14. Note that the edge cover 17 is provided so that a part of the edge cover 17 covers a part of the peripheral edge of the island pattern of the first electrode 14, and has a function to reduce the possibility of short-circuits between the first electrode 14 and the second electrode 16. Those regions on the first electrode 14 where the edge cover 17 is not provided serve as the light-emitting regions P. The edge cover 17 has a thickness of, e.g., 1.5-2.0 µm. The light-emitting regions P where the edge cover 17 is not provided have, e.g., a rectangular shape having a longitudinal dimension of about 50 nm and a lateral dimension of about 50 nm.

A material of the edge cover 17 is, e.g., an insulating material such as a silicon resin, a polyimide resin, a polyacrylic resin, etc. The edge cover 17 is provided in contact with the organic EL layer 15. Thus, if the edge cover 17 contains a large amount of water, the water may enter the organic EL layer 15 and may degrade the organic EL layer 15. Accordingly, the edge cover 17 is preferably made of a material having low water absorbability.

The organic EL layer 15 is formed by sequentially stacking a hole injection layer, a hole transport layer, a light-emitting layer, an electron transport layer, and an electron injection layer from the side of the first electrode 14. Note that the organic EL layer 15 need only include at least the light-emitting layer, and the hole injection layer, the hole transport layer, the electron transport layer, and the electron injection layer can be provided as appropriate according to the characteristics required for the organic EL display device 10 to be fabricated. The hole injection layer and the hole transport layer may be provided as a single layer, and the electron transport layer and the electron injection layer may be provided as a single layer.

The hole injection layer and the hole transport layer have a function to enhance hole injection efficiency and hole transport efficiency into the light-emitting layer, respectively. In the case of providing the hole injection layer and the hole transport layer as a single layer serving as both the hole injection layer and the hole transport layer, this layer serving as both the hole injection layer and the hole transport layer may be made of, e.g., a biphenyldiamine derivative such as α-naphthyldiamine (α-NPD). This layer serving as both the hole injection layer and the hole transport layer has a thickness of, e.g., about 100 nm Not that the hole injection layer and the hole transport layer may be provided so as to cover the entire substrate surface, or may be patterned so as to correspond to the light-emitting regions P.

The light-emitting layer has a function to emit light by recombining holes injected from the first electrode 14 with electrons injected from the second electrode 16. The light-emitting layer is provided in an island pattern so that a light-emitting material of each luminescent color corresponds to the light-emitting regions P of that color. The light-emitting layer is made of a material having high light emission efficiency, such as a low molecular weight fluorescent dye, a fluorescent polymer, a metal complex, etc. For example, the light-emitting layer is formed by codepositing, e.g., 4,4'-bis (carbazole-9-yl)-biphenyl (CBP), etc. as a host material and, e.g., a tris-phenylpyridinato iridium (III) complex (Ir(ppy)$_3$), etc. as a dopant. The light-emitting layer has a thickness of, e.g., 10 to 100 nm Note that if adjoining ones of the light-emitting regions P are the light-emitting regions P of the same luminescent color, the light-emitting layer may not be provided in the island pattern. In this case, the light-emitting layer is provided so as to cover a part of the edge cover 17 or the entire edge cover 17.

A buffer layer may be provided between the light-emitting layer and the electron transport layer. The buffer layer has a function to block entrance of the holes into the electron transport layer. The buffer layer is made of, e.g., a bathocuproine (BCP) derivative, etc., and has a thickness of, e.g., about 10 nm.

The electron transport layer and the electron injection layer have a function to enhance electron transport efficiency and electron injection efficiency from the second electrode 16 to the light-emitting layer, respectively. The electron transport layer is made of, e.g., tris(8-hydroxyquinoline)aluminum (Alq3), etc., and has a thickness of about 30 nm The electron injection layer is made of, e.g., lithium fluoride (LiF), etc., and has a thickness of about 0.5 nm. Note that the electron transport layer and the electron injection layer may be provided so as to cover the entire substrate surface, or may be patterned so as to correspond to the light-emitting regions P.

The second electrode 16 is provided over the entire surface of the TFT substrate S so as to cover the organic EL layer 15 and the edge cover 17. The second electrode 16 has a function to inject electrons into the organic EL layer 15. The second electrode 16 is made of a metal having a small work function, etc., and has a semi-light-transmitting property or a light-transmitting property. The material of the second electrode 16 is, e.g., aluminum (Al), magnesium alloy (MgAg, etc.), aluminum alloy (AlLi, AlCa, AlMg, etc.), metal calcium, etc. The second electrode 16 has a thickness of, e.g., about 20 nm.

A protective film (not shown) may be provided so as to cover the second electrode 16. The protective film has a function to block entrance of oxygen and water into the organic EL layer 15. The protective film is made of an insulating or conductive material. The material of the protective film is, e.g., silicon nitride, silicon oxide, etc. The protective film has a thickness of, e.g., 100-1,000 nm.

The sealing member is made of, e.g., glass, plastic, etc. A hollow portion sealed by the sealing member is filled with, e.g., inert gas such as dry nitrogen, argon, etc. The sealing member has a thickness of, e.g., 0.4-1.1 mm. The longitudinal and lateral lengths of the sealing member may be adjusted as appropriate according to the dimensions of the organic EL display device 10, or may be substantially the same as the TFT substrate S. In the case where the longitudinal and lateral lengths of the sealing member are substantially the same as the TFT substrate S, the sealing member may be cut according to the size of the organic EL display device 10 after being formed to seal the TFT substrate S. Note that the hollow portion formed between the sealing member and the TFT substrate S may be filled with a resin such as an epoxy resin, instead of the inert gas.

It is preferable that a desiccant be bonded to the surface (the substrate-side surface) of the sealing member located on the side of the substrate. For example, a recess may be provided in the substrate-side surface of the sealing member in order to bond the desiccant to the substrate-side surface of the sealing member. In this case, the recess has a depth of, e.g., 0.2-0.3 mm.

The desiccant is, e.g., in the form of a sheet or liquid. The desiccant is, e.g., calcium oxide, barium oxide, etc. The desiccant thus bonded to the substrate-side surface of the sealing member is capable of absorbing water entering the organic EL display device 10 from the outside, thereby reducing the possibility of degradation of the organic EL layer 15 by the water entering from the outside.

Polarizers are provided on the outer surface of the sealing member and the outer surface of the TFT substrate, respectively.

In this organic EL display device 10, when the TFT 12 is turned on by a signal input from an interconnect, holes are injected from the first electrode 14 into the organic EL layer 15, and electrons are injected from the second electrode 16 into the organic EL layer 15. The holes recombine with the electrons within the light-emitting layer. The electrons in the excited state due to the recombination release deactivation energy when returning to the ground state, and this deactivation energy is emitted as light. A predetermined image can be displayed on the organic EL display device 10 by controlling the luminance of each light-emitting region P.

[Manufacturing Method of Organic EL Display Device]

A manufacturing method of the organic EL display device 10 of the first embodiment will be described below. The manufacturing method of the organic EL display device 10 includes a TFT substrate fabrication step, a first electrode formation step, an organic EL layer formation step, a second electrode formation step, and a sealing step.

(TFT Substrate Fabrication Step)

First, a glass substrate, etc. is prepared as a substrate 11 of a TFT substrate S, Next, a silicon semiconductor film is formed on the substrate surface by using a plasma chemical vapor deposition (CVD) method, etc., and the substrate is then subjected to a crystallization treatment and an etching process to form a polysilicon semiconductor film having an island pattern. A gate insulating film and a gate electrode layer are sequentially formed on the polysilicon semiconductor film having the island pattern, and an etching process is performed. Then, doping is performed to form source and drain regions in each island of the polysilicon semiconductor film having the island pattern. A plurality of TFTs 12 are produced in this manner.

Then, an interlayer insulating film 13 is formed so as to cover the substrate surface and the TFTs 12 provided thereon. In the case where the interlayer insulating film 13 is formed as, e.g., a stacked body of a silicon nitride film and an acrylic resin film, the silicon nitride film is first formed by a plasma CVD method, etc., and then source lines are formed, and the acrylic resin film is formed with a spin coater so as to cover the silicon nitride film and the source lines. Thereafter, contact holes extending to the drain regions are formed in the interlayer insulating film 13.

(First Electrode Formation Step)

First Electrode Patterning Step

A silver film is formed by, e.g., an ion beam (EB) method, etc., and is patterned by etching with a very mild etchant to form a first electrode 14. The very mild etchant used in this etching is, e.g., an iron chloride solution having a low concentration of about 0.1 mol %. The etching temperature is as low as, e.g., about 30° C.

Figure 3A:
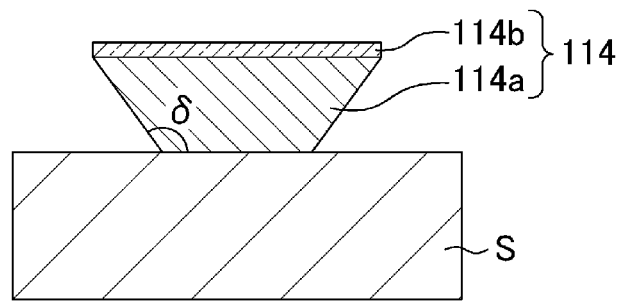
FIG. 3A is a diagram illustrating an angle that is formed between a substrate and a wall surface of a first electrode in a cross-sectional shape of the first electrode in a conventional organic EL display device.
Figure 3B:
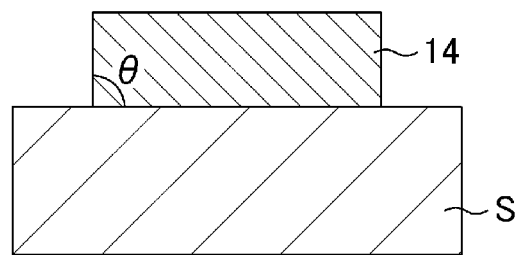
FIG. 3B is a diagram illustrating an angle that is formed between a substrate and a wall surface of a first electrode in a cross-sectional shape of the first electrode in the organic EL display device of the first embodiment.

In the case of etching a first electrode 114 formed by a silver film 114*a* (thickness: 100 nm) and an ITO film 114*b* (thickness: 10 nm) as an upper layer formed on the silver film 114*a*, the angle δ between the TFT substrate S and a wall surface of the first electrode 114 in a cross section of the first electrode 114 is about 95-170° as shown in FIG. 3A as related art, because silver is more susceptible to etching than ITO. In the above method, however, since the first electrode 14 formed only by the silver film is etched, the upper and lower layers of the first electrode 14 are uniformly susceptible to the etching. Thus, the first electrode 14 can be patterned so that an angle θ of 80-95° is formed between the TFT substrate S and the wall surface of the first electrode 14 in the cross section of the first electrode 14, as shown in FIG. 3B.

Edge Cover Formation Step

Then, a $SiO_2$ insulating film is formed as an edge cover 17 so as to cover the peripheral edge of the first electrode 14.

Pretreatment Step

After forming the edge cover 17, batch cleaning and the subsequent UV/ozone treatment are performed to remove dust on the substrate surface. If dust is present between the first electrode 14 and the organic EL layer 15, the dust hinders light emission in that portion, thereby reducing luminance. In addition, the organic EL layer 15 is degraded from the portion where the dust is present, and a region where no light is emitted may increase in area, resulting in dark spots.

The batch cleaning is specifically a treatment of cleaning the substrate with pure water. For example, this treatment is performed at a temperature of 25-70° C. for 5-20 minutes.

The UV/ozone treatment is specifically a treatment of treating the substrate with UV light. For example, this treatment is performed at a temperature of 25° C. for 0.5-5 minutes. The UV/ozone treatment can be performed by using, e.g., an apparatus such as a mercury lamp, an excimer lamp, etc.

Figure 4:
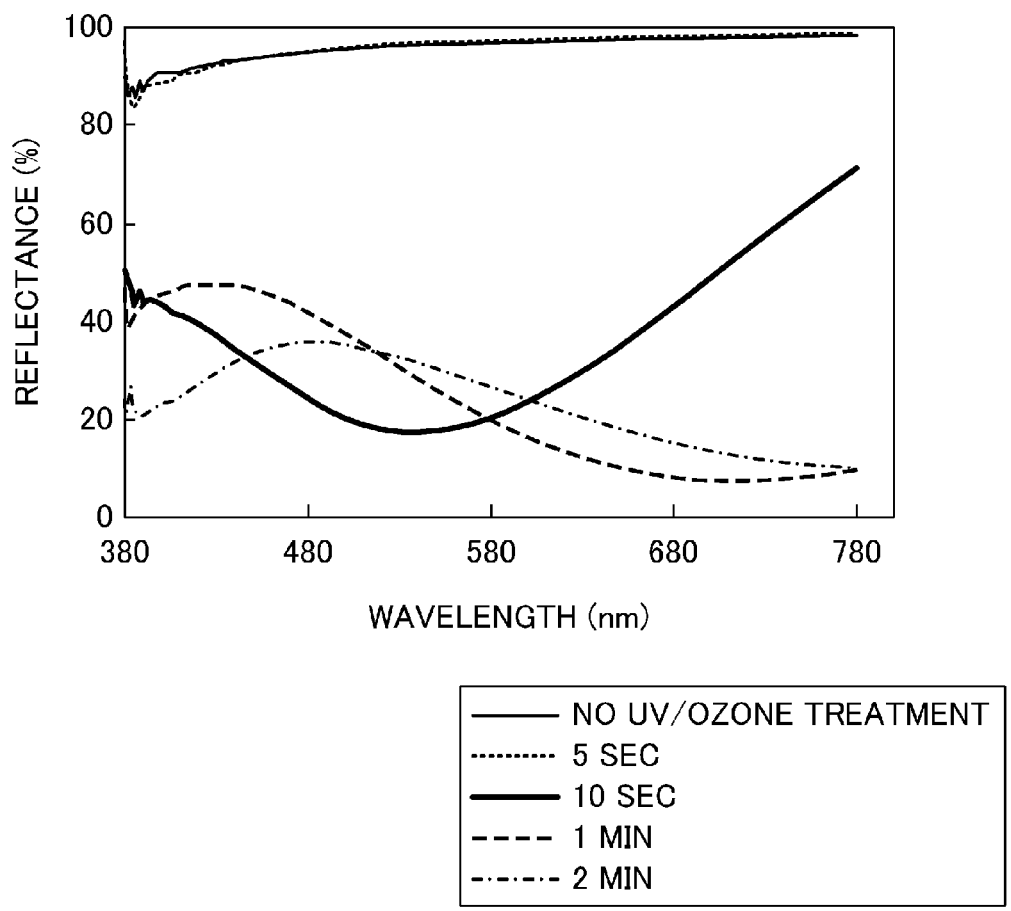
FIG. 4 is a graph showing the relation between light wavelength and light reflectance of the first electrode for each UV/ozone treatment time.

At this time, silver at the surface of the first electrode 14 is oxidized into silver oxide due to the UV/ozone treatment. FIG. 4 is a graph showing the relation between light wavelength and light reflectance of the first electrode 14 for each UV/ozone treatment time. The graph shows that the light reflectance decreases as the UV/ozone treatment time increases.

Note that in addition to the UV/ozone treatment, an oxygen plasma treatment may be performed as a pretreatment for removing dust from the first electrode 14. The oxygen plasma treatment is specifically a treatment of slightly etching the substrate by plasma discharge under an oxygen gas atmosphere. At this time, both the UV/ozone treatment and the oxygen plasma treatment may be performed as a pretreatment, or only one of the UV/ozone treatment and the oxygen plasma treatment may be performed as the pretreatment.

Silver Oxide Decomposition Step

After performing the UV/ozone treatment in the pretreatment step, a reduction reaction of silver oxide is caused in the silver oxide decomposition step to activate the surface portion of the first electrode 14. Specifically, a baking treatment is sequentially performed under a vacuum atmosphere having a pressure of about $1.0 \times 10^{-4}$ Pa or less and under a nitrogen atmosphere.

The baking temperature is higher than 160° C. as a decomposition temperature of silver oxide. The baking treatment is performed at, e.g., about 220° C. Specifically, for example, the substrate is first baked at 220° C. for about 5 hours under a vacuum atmosphere, and then baked at 220° C. for about 5 hours under a nitrogen atmosphere to decompose silver oxide.

After this decomposition of silver oxide, the surface portion of the first electrode 14 contains about 0.01-10.0 mass % of oxygen. Note that the oxygen content rate can be measured by X-ray electron spectroscopy. The oxygen content rate of the surface portion of the first electrode 14 is less than 0.01 mass % immediately after the silver film is formed in the first electrode patterning step. Thus, the oxygen content rate is higher than this value even if silver oxide is decomposed in the silver oxide decomposition step. However, since the baking treatment is performed under the vacuum atmosphere and the nitrogen atmosphere to decompose silver oxide, a high light-reflecting property and a low light-transmitting property can be obtained which are about the same as those of the silver film that has just been formed and thus has not been oxidized.

Note that although the baking treatment under the vacuum atmosphere and the baking treatment under the nitrogen atmosphere are sequentially performed in the above example, only one of the baking treatments may be performed, or the baking treatment under the vacuum atmosphere may be performed after the baking treatment under the nitrogen atmosphere.

(Organic El Layer Formation Step)

After the decomposition of silver oxide, an organic EL layer 15 is formed so as to cover the first electrode 14.

First, an α-NPD film having a thickness of about 100 nm is formed as a layer serving as both a hole injection layer and a hole transport layer at a deposition rate of about 1 Å/s by, e.g., a vacuum deposition method.

Next, for example, CBP as a host and $Ir(ppy)_3$ as a dopant are codeposited under vacuum conditions to form a light-emitting layer. At this time, the deposition rate of CBP is, e.g., about 1 Å/s, and the deposition rate of $Ir(ppy)_3$ is, e.g., about 0.1 Å/s.

Then, a BCP film having a thickness of about 10 nm is formed as a buffer layer at a deposition rate of about 1 Å/s by using, e.g., a vacuum deposition method.

Thereafter, an Alq3 film having a thickness of about 30 nm is formed as an electron transport layer at a deposition rate of about 1 Å/s by using, e.g., a vacuum deposition method.

Lastly, a LiF film having a thickness of about 0.5 nm is formed as an electron injection layer at a deposition rate of about 1 Å is by using, e.g., a vacuum deposition method.

(Second Electrode Formation Step)

Subsequently, an aluminum film is formed as a second electrode 16 so as to cover at least the light-emitting regions P of the substrate surface. If formed with a small thickness, the aluminum film can be formed as a semitransparent film having both an electron injecting property and a high light-reflecting property and a high light-transmitting property. Thus, an organic EL display device 10 of a microcavity structure having a uniform light emission wavelength and high luminance can be implemented. Note that the organic EL display device 10 may not have the microcavity structure, and the aluminum film of the second electrode 16 may be a light-transmitting film.

(Sealing Step)

Lastly, a protective film of $SiO_2$ is formed by, e.g., a vapor deposition method so as to cover the second electrode 16. Then, the protective film is bonded to a glass substrate by, e.g., laser welding so as to seal the first electrode 14, the organic EL layer 15, and the second electrode 16. Note that instead of the laser welding, the sealing step may be performed by a sealant filling method, a method in which the substrate is bonded to the glass substrate by an adhesive and the adhesive is cured by UV radiation or heating, etc.

The organic EL display device 10 of the first embodiment can be manufactured by this manufacturing method.

Note that although the first electrode 14 is made of the silver film in the above example, the first electrode 14 may be made of a silver alloy film as described above regarding the configuration of the organic EL display device 10.

(Advantages of First Embodiment)

According to the organic EL display device 10 of the first embodiment described above, since the first electrode 14 is made of silver or silver alloy, the first electrode 14 can be formed to have high reflectance and low transmittance at its surface located on the opposite side from the substrate. Thus, light can be efficiently emitted from the side of the second electrode 16.

For example, comparison between an organic EL display device having a first electrode made of a silver film (thickness: 100 nm) and an organic EL display device having a first electrode formed by stacking an aluminum film (thickness: 100 nm) and an ITO film (thickness: 10 nm) shows that the former organic EL display device has luminance of 50 cd/A, while the latter has luminance of 42 cd/A. Note that these organic EL display devices are the same except the configuration of the first electrode.

In the case where the first electrode 14 is formed by stacking those materials which are susceptible to etching to different degrees, such as silver and ITO, etc., the patterned shape of the first electrode 14 varies between the upper and lower portions of the first electrode 14. In the organic EL display device 10 of the first embodiment, however, the first electrode 14 is made of a single layer of either a silver film or a silver alloy film. Thus, the entire first electrode 14 can be etched at a uniform etching rate. Accordingly, the lower part of the first electrode 14 is not excessively etched and no void is formed between the TFT substrate S and the first electrode 14, thereby reducing degradation of organic EL light emission characteristics due to entrance of oxygen, etc. into the first electrode 14 and the organic EL layer 15 from the void portion.

For example, comparison between an organic EL display device having a first electrode made of a silver film (thickness: 100 nm) and an organic EL display device having a first electrode formed by stacking a silver film (thickness: 100 nm) and an ITO film (thickness: 10 nm) shows that the former organic EL display device has a longer light emission life than the latter. Note that these organic EL display devices are the same except the configuration of the first electrode.

Moreover, since a transparent electrode such as ITO is not used for the first electrode 14, manufacturing cost can be reduced accordingly.

(Second Embodiment)

An organic EL display device 10 according to a second embodiment will be described below. Note that the same configurations as those of the first embodiment are denoted by the same reference characters. The organic EL display device 10 has the same configuration as the first embodiment.

[Manufacturing Method of Organic EL Display Device]

A manufacturing method of the organic EL display device 10 of the second embodiment is the same as that of the first embodiment except the silver oxide decomposition step in the first electrode formation step. Thus, only the silver oxide decomposition step will be described below.

(First Electrode Formation Step)

Silver Oxide Decomposition Step

After the UV/ozone treatment in the pretreatment step, a reduction reaction of silver oxide is caused in the substrate in the silver oxide decomposition step to activate the surface portion of the first electrode 14. Specifically, silver oxide is reduced by using a reduction agent under an atmosphere having an oxygen concentration equal to or less than an atmospheric oxygen concentration.

For example, the atmosphere having an oxygen concentration equal to or less than the atmospheric oxygen concentration is a vacuum atmosphere, an atmosphere filled with inert gas such as nitrogen to reduce oxygen, etc.

The reduction agent is, e.g., an alkali such as hydrogen, carbon, carbon monoxide, sodium hydrogen carbonate, etc.

After this decomposition of silver oxide, the surface portion of the first electrode 14 contains about 0.01-10.0 mass % of oxygen. The oxygen content rate of the surface portion of the first electrode 14 is less than 0.01 mass % immediately after the silver film is formed in the first electrode patterning step. Thus, the oxygen content rate is higher than this value even if silver oxide is decomposed in the silver oxide decomposition step. However, since silver oxide is reduced by a reaction with the reduction agent under a low oxygen atmosphere, a high light-reflecting property and a low light-transmitting property can be obtained which are about the same as those of the silver film that has just been formed and thus has not been oxidized.

(Advantages of Second Embodiment)

According to the manufacturing method of the organic EL display device 10 of the second embodiment, silver oxide at the surface of the first electrode 14 can be decomposed by the reduction reaction with the reduction agent in the silver oxide decomposition step, whereby advantages similar to those of the first embodiment can be obtained.

(Third Embodiment)

An organic EL display device 10 according to a third embodiment will be described below. Note that the same configurations as those of the first embodiment are denoted by the same reference characters. This organic EL display device 10 has the same configuration as the first embodiment.

[Manufacturing Method of Organic EL Display Device]

A manufacturing method of the organic EL display device of the third embodiment is the same as that of the first embodiment except the silver oxide decomposition step in the first electrode formation step. Thus, only the silver oxide decomposition step will be described below.

(First Electrode Formation Step)

Silver Oxide Decomposition Step

After the UV/ozone treatment in the pretreatment step, a reduction reaction of silver oxide is caused in the substrate in the silver oxide decomposition step to activate the surface portion of the first electrode 14. Specifically, the surface is irradiated with light under an atmosphere having a reduced pressure of $5 \times 10^{-4}$ Pa or less, thereby decomposing silver oxide.

For example, the first electrode 14 is irradiated with light of 10,000 mJ. For example, a mercury lamp, an excimer lamp, etc. can be used to irradiate the first electrode 14 with light.

After this light radiation, the surface portion of the first electrode 14 contains about 0.01-10.0 mass % of oxygen. The oxygen content rate of the surface portion of the first electrode 14 is less than 0.01 mass % immediately after the silver film is formed in the first electrode patterning step. Thus, the oxygen content rate is higher than this value even if silver oxide is decomposed in the silver oxide decomposition step. However, since silver oxide is photodecomposed under a reduced pressure atmosphere, a high light-reflecting property and a low light-transmitting property can be obtained which are about the same as those of the silver film that has just been formed and thus has not been oxidized.

(Advantages of Third Embodiment)

According to the manufacturing method of the organic EL display device 10 of the third embodiment, silver oxide at the surface of the first electrode 14 can be decomposed by light radiation in the silver oxide decomposition step, whereby advantages similar to those of the first embodiment can be obtained.

(Fourth Embodiment)

[Organic EL Display Device]

Figure 5:
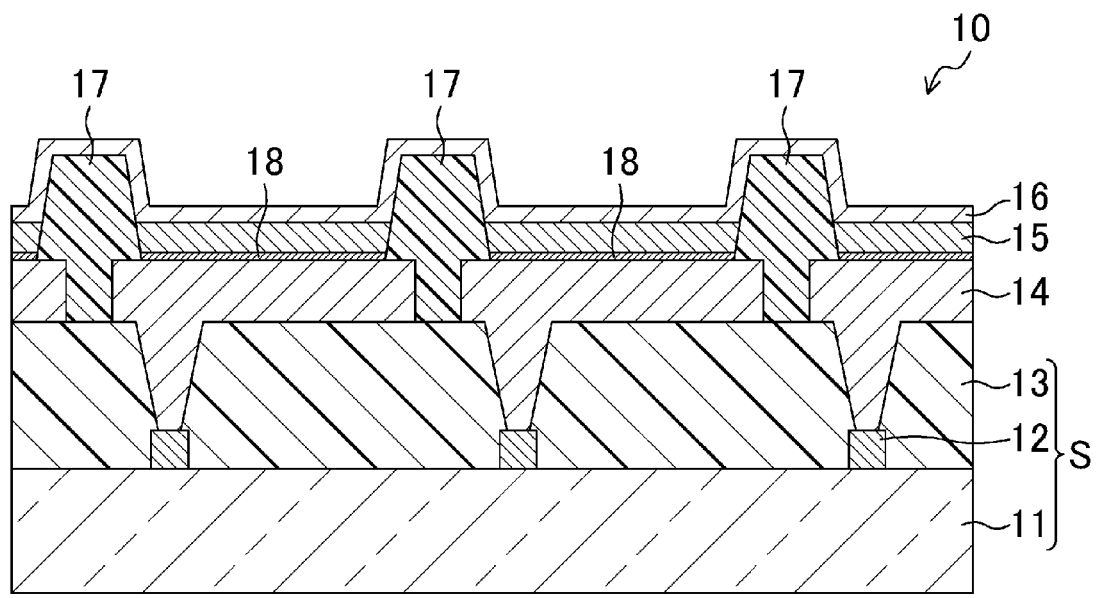
FIG. 5 is a cross-sectional view of an organic EL display device according to a fourth embodiment.

An organic EL display device 10 according to a fourth embodiment will be described below with reference to FIG. 5. Note that the same configurations as those of the first embodiment are denoted by the same reference characters. This organic EL display device 10 has the same configuration as the first embodiment except that an oxygen trap layer 18 is provided between the first electrode 14 and the organic EL layer 15.

The oxygen trap layer 18 is provided so as to cover, e.g., the entire region where the first electrode 14 is provided. The oxygen trap layer 18 has a function to trap a substance that is produced from the first electrode 14 and damages the organic EL layer 15, such as active oxygen, radicals, etc. A material of the oxygen trap layer 18 is, e.g., magnesium oxide, hydroquinone, 3,5-dibutyl-4-hydroxytoluene, amylene(2-methyl-2-butene), etc. The oxygen trap layer 18 has a thickness of, e.g., 0.1-3 nm. The oxygen trap layer 18 having a thickness of less than 0.1 nm may not sufficiently produce an effect of trapping oxygen, etc. The oxygen trap layer 18 having a thickness of more than 3 nm may lose its own conductive property.

[Manufacturing Method of Organic EL Display Device]

A manufacturing method of the organic EL display device 10 of the fourth embodiment will be described below. This manufacturing method is the same as the first embodiment except that this manufacturing method further includes an oxygen trap layer formation step of forming the oxygen trap layer 18 after the silver oxide decomposition step in the first electrode formation step.

(First Electrode Formation Step)

Oxygen Trap Layer Formation Step

In the oxygen trap layer formation step, an oxygen trap layer 18 configured to trap active oxygen or radicals is formed on the first electrode 14 that contains 0.01-10.0 mass % of oxygen in the surface portion thereof as a result of the silver oxide decomposition step.

For example, in the case where the oxygen trap layer 18 is made of a magnesium oxide film, the oxygen trap layer 18 is formed at a low rate of about 1 Å or less by using an ion beam (EB) deposition method. In the case where the oxygen trap layer 18 is made of hydroquinone, 3,5-dibutyl-4-hydroxytoluene, amylene(2-methyl-2-butene), etc., the oxygen trap layer 18 is formed at a low rate of about 1 Å or less by using a vacuum deposition method.

Note that the silver oxide decomposition step may be performed by a method in which a baking treatment is performed under a vacuum or nitrogen atmosphere as in the first embodiment, a method using a reduction agent in an atmosphere having an oxygen concentration equal to or less than an atmospheric oxygen concentration as in the second embodiment, or a method in which light is radiated under a vacuum or nitrogen atmosphere as in the third embodiment.

(Advantages of Fourth Embodiment)

The organic EL display device 10 of the fourth embodiment described above includes the oxygen trap layer 18 between the first electrode 14 and the organic EL layer 15. Thus, even if active oxygen, radicals, etc. are produced from silver oxide that is present at the opposite surface of the first electrode 14 from the substrate, the active oxygen, radicals, etc. are trapped and absorbed by the oxygen trap layer 18, and thus are less likely to reach the organic EL layer 15. This reduces degradation of the organic EL layer 15, whereby the organic EL display device 10 having a long light emission life can be obtained.

(Fifth Embodiment)

[Organic EL Display Device]

An organic EL display device 10 according to a fifth embodiment will be described below. Note that the same configurations as those of the first embodiment are denoted by the same reference characters. This organic EL display device 10 has the same configuration as the fourth embodiment except that the oxygen trap layer 18 is replaced with an oxygen blocking layer.

The oxygen blocking layer is provided so as to cover, e.g., the entire region where the first electrode 14 is provided. The oxygen blocking layer has a function to block a substance that is produced from the first electrode 14 and damages the organic EL layer 15, such as active oxygen, radicals, etc., so as not to allow the substance to enter the organic EL layer 15. A material of the oxygen blocking layer is, e.g., an alkali metal compound such as LiF, an alkaline earth metal compound, a low conductive metal, a metal oxide such as $TiO_2$, etc. The oxygen blocking layer preferably has a thickness of, e.g., 0.1-3 nm, and more preferably 1-2 nm. The oxygen blocking layer having a thickness of less than 0.1 nm may not sufficiently produce an effect of blocking oxygen, etc. The oxygen blocking layer having a thickness of more than 3 nm may lose its own conductive property.

[Manufacturing Method of Organic EL Display Device]

A manufacturing method of the organic EL display device 10 of the fifth embodiment will be described below. This manufacturing method is the same as the first embodiment except that this manufacturing method further includes an oxygen blocking layer formation step of forming an oxygen blocking layer after the silver oxide decomposition step in the first electrode formation step.

(First Electrode Formation Step)

Oxygen Blocking Layer Formation Step

In the oxygen blocking layer formation step, an oxygen blocking layer configured to block entrance of active oxygen or radicals into the organic EL layer 15 is formed on the first electrode 14 that contains 0.01-10.0 mass % of oxygen in the surface portion thereof as a result of the silver oxide decomposition step. For example, in the case where the oxygen blocking layer is made of a film of an alkali metal compound, an alkaline earth metal compound, a low conductive metal, or a metal oxide, the oxygen blocking layer is formed at a low rate of about 1 Å or less by using a vacuum deposition method (resistance heating).

Note that the silver oxide decomposition step may be performed by a method in which a baking treatment is performed under a vacuum or nitrogen atmosphere as in the first embodiment, a method using a reduction agent in an atmosphere having an oxygen concentration equal to or less than an atmospheric oxygen concentration as in the second embodiment, or a method in which light is radiated under a vacuum or nitrogen atmosphere as in the third embodiment.

(Advantages of Fifth Embodiment)

The organic EL display device 10 of the fifth embodiment described above includes the oxygen blocking layer between the first electrode 14 and the organic EL layer 15. Thus, even if active oxygen, radicals, etc. are produced from silver oxide that is present at the opposite surface of the first electrode 14 from the substrate, the active oxygen, radicals, etc. cannot pass through the oxygen blocking layer, and thus are not allowed to enter the organic EL layer 15. This reduces degradation of the organic EL layer 15, whereby the organic EL display device 10 having a long light emission life can be obtained.

For example, regarding the organic EL display devices having the first electrode made of a silver film, it was verified that the panel life of the organic EL display devices having the oxygen blocking layer is longer by about 10% than that of the organic EL display devices having no oxygen blocking layer.

(Sixth Embodiment)

[Organic EL Display Device]

An organic EL display device 10 according to a sixth embodiment will be described below. Note that the same configurations as those of the first embodiment are denoted by the same reference characters. This organic EL display device 10 has the same configuration as the first embodiment except that this organic EL display device 10 is of a bottom emission type that emits light of the organic EL layer 15 from the side of the substrate.

In this case, the first electrode 14 has a light-transmitting property or a semi-light-transmitting property, while the second electrode 16 has a light-reflecting property. Specifically, the first electrode 14 is made of, e.g., silver with a thickness of about 10-20 nm, or is made of a transparent conductive film of ITO, indium zinc oxide (IZO), etc. with a thickness of about 100 nm Note that in the case where the first electrode 14 has a semi-light-transmitting property, a microcavity structure capable of selectively transmitting a predetermined wavelength therethrough can be implemented. In this case, the organic EL display device 10 having a uniform light emission wavelength and high luminance can be implemented.

The second electrode 16 is made of, e.g., silver, etc. with a thickness of about 20 nm.

[Manufacturing Method of Organic EL Display Device]

A manufacturing method of the organic EL display device 10 of the sixth embodiment is similar to that of a top emission type organic EL display device 10 except that the thicknesses of the first electrode 14 and the second electrode 14, etc. are changed.

Note that the silver oxide decomposition step may be performed by a method in which a baking treatment is performed under a vacuum or nitrogen atmosphere as in the first embodiment, a method using a reduction agent in an atmosphere having an oxygen concentration equal to or less than an atmospheric oxygen concentration as in the second embodiment, or a method in which light is radiated under a vacuum or nitrogen atmosphere as in the third embodiment.

(Seventh Embodiment)

[Organic EL Display Device]

An organic EL display device 10 of a seventh embodiment will be described below. Note that the same configurations as those of the first embodiment are denoted with the same reference characters. This organic EL display device 10 is of an inverted top emission type in which electrons are injected from the first electrode 14 into the organic EL layer 15, and holes are injected from the second electrode 16 into the organic EL layer 15 to implement organic EL light emission. That is, the first electrode 15 is a cathode, and the second electrode 16 is an anode.

In this case, the first electrode 14 is made of, e.g., aluminum with a thickness of about 100 nm. The second electrode 16 is made of, e.g., silver, a transparent electrode (ITO, IZO, etc.), etc. The second electrode 16 made of silver is formed with a thickness of about 20 nm, and the second electrode 16 made of the transparent electrode is formed with a thickness of about 100 nm Note that the inverted top emission type organic EL display device 10 may be of either a top emission type or a bottom emission type.

[Manufacturing Method of Organic EL Display Device]

A manufacturing method of the organic EL display device 10 of the seventh embodiment is similar to that of the top emission type organic EL display device 10 except that the thicknesses of the first electrode 14 and the second electrode 14 are changed, etc.

Note that the silver oxide decomposition step may be performed by a method in which a baking treatment is performed under a vacuum or nitrogen atmosphere as in the first embodiment, a method using a reduction agent in an atmosphere having an oxygen concentration equal to or less than an atmospheric oxygen concentration as in the second embodiment, or a method in which light is radiated under a vacuum or nitrogen atmosphere as in the third embodiment.

INDUSTRIAL APPLICABILITY

The present invention is useful for organic EL display devices and manufacturing methods thereof.

DESCRIPTION OF REFERENCE CHARACTERS

10 Organic EL Display Device
11 Substrate
14 First Electrode
15 Organic EL Layer
16 Second Electrode
19 Oxygen Trap Layer

The invention claimed is:

1. An organic electroluminescent display device, comprising:
   a substrate:
   a first electrode which is provided on the substrate, and in which at least a surface portion located on an opposite side from the substrate is made of silver or silver alloy;
   an organic electroluminescent layer provided on the first electrode;
   an edge cover provided corresponding to a region where the first electrode is not provided, so as to cover a peripheral edge of the first electrode; and
   a functional layer provided between the first electrode and the organic electroluminescent layer and having a predetermined function, wherein
   the functional layer covers the entire region where the first electrode is exposed from the edge cover,
   the functional layer is an oxygen blocking layer, and
   the organic electroluminescent layer is formed by sequentially stacking a hole injection layer, a hole transport layer, a light-emitting layer, an electron transport layer, and an electron injection layer on the functional layer.

2. The organic electroluminescent display device of claim 1 wherein
   the first electrode is made of only the silver or the silver alloy.

3. The organic electroluminescent display device of claim 1, wherein
at least the surface portion of the first electrode located on the opposite side from the substrate contains 0.01 to 10.0 mass % of oxygen.

4. The organic electroluminescent display device of claim 1, wherein
an angle between the substrate and a wall surface of the first electrode in a cross section of the first electrode is 80 to 95°.

5. The organic electroluminescent display device of claim 1, wherein
the oxygen blocking layer is made of any of an alkali metal compound, an alkaline earth metal compound, a low conductive metal, and a metal oxide.

6. The organic electroluminescent display device of claim 1, wherein
the oxygen blocking layer has a thickness of 0.1 to 3 nm.

7. The organic electroluminescent display device of claim 1, wherein
the organic electroluminescent display device is of a top emission type that is configured to emit light from the opposite side from the substrate.

8. The organic electroluminescent display device of claim 1, wherein
the organic electroluminescent display device is of a bottom emission type that is configured to emit light from a side of the substrate.

9. The organic electroluminescent display device of claim, wherein
the organic electroluminescent display device is of an inverted top emission type in which the first electrode is a cathode, and which is configured to emit light from the opposite side from the substrate.

* * * * *